US012276680B2

(12) United States Patent
Liang et al.

(10) Patent No.: US 12,276,680 B2
(45) Date of Patent: Apr. 15, 2025

(54) ABNORMAL DETECTION CIRCUIT FOR DETECTING THREE-PHASE AC POWER

(71) Applicant: Industrial Technology Research Institute, Hsinchu (TW)

(72) Inventors: Wen-Cheng Liang, Chiayi (TW); Teng-Chieh Yang, Pingtung County (TW); Chi-Tien Sun, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 136 days.

(21) Appl. No.: 18/077,147

(22) Filed: Dec. 7, 2022

(65) Prior Publication Data

US 2024/0133928 A1 Apr. 25, 2024
US 2024/0230728 A9 Jul. 11, 2024

(30) Foreign Application Priority Data

Oct. 20, 2022 (TW) .................................. 111139913

(51) Int. Cl.
*G01R 19/165* (2006.01)
*G01R 22/06* (2006.01)

(52) U.S. Cl.
CPC . *G01R 19/16523* (2013.01); *G01R 19/16576* (2013.01); *G01R 19/1659* (2013.01); *G01R 22/068* (2013.01)

(58) Field of Classification Search
CPC .............................. G01R 19/00; G01R 19/165; G01R 19/16504; G01R 19/16523; G01R 19/16566; G01R 19/16576; G01R 19/1659; G01R 22/00; G01R 22/06; G01R 22/061; G01R 22/068; G01R 31/00; G01R 31/40;
(Continued)

(56) References Cited

U.S. PATENT DOCUMENTS 5,319,514 A 6/1994 Walsh et al.
2017/0265287 A1 9/2017 Avrahamy

FOREIGN PATENT DOCUMENTS

CN 2591633 12/2003
CN 1866659 11/2006
(Continued)

OTHER PUBLICATIONS

"Office Action of Taiwan Counterpart Application", issued on Jun. 20, 2023, p. 1-p. 9.
(Continued)

*Primary Examiner* — Hoai-An D. Nguyen
(74) *Attorney, Agent, or Firm* — JCIPRNET

(57) ABSTRACT

An abnormal detection circuit is provided. The abnormal detection circuit includes a conversion circuit, a voltage detection circuit, and a warning circuit. The conversion circuit receives a three-phase alternating current (AC) power and converts the three-phase AC power into a driving power. The voltage detection circuit detects each phase of the three-phase AC power. When a voltage value of at least one phase AC power of the three-phase AC power is abnormal, the voltage detection circuit uses the driving power to output at least one control signal corresponding to the abnormality. The warning circuit is driven by receiving the driving power and outputs at least one warning signal corresponding to the abnormality in response to the at least one control signal.

16 Claims, 10 Drawing Sheets

(58) Field of Classification Search
CPC ........ G01R 31/42; G08B 21/00; G08B 21/18;
G08B 21/185
USPC .............................................. 324/76.11, 107
See application file for complete search history.

(56) References Cited

FOREIGN PATENT DOCUMENTS

| | | | |
|---|---|---|---|
| CN | 200941114 | 8/2007 | |
| CN | 201066371 | 5/2008 | |
| CN | 202353175 | 7/2012 | |
| CN | 102967794 | 3/2013 | |
| CN | 106159909 | 11/2016 | |
| CN | 110417249 | 11/2019 | |
| JP | 2010183751 | 8/2010 | |
| KR | 19990024440 | 4/1999 | |
| KR | 101487618 B1 * | 1/2015 | ....... G01R 19/16538 |
| KR | 101745972 B1 * | 6/2017 | ........... G08B 21/185 |
| TW | 201425965 | 7/2014 | |
| TW | 201641944 | 12/2016 | |
| WO | 2005012928 | 2/2005 | |

OTHER PUBLICATIONS

"Office Action of Korea Counterpart Application", issued on Feb. 17, 2025, p. 1-p. 6.

* cited by examiner

ABNORMAL DETECTION CIRCUIT FOR DETECTING THREE-PHASE AC POWER

CROSS-REFERENCE TO RELATED APPLICATION

This application claims the priority benefit of Taiwan application serial no. 111139913, filed on Oct. 20, 2022. The entirety of the above-mentioned patent application is hereby incorporated by reference herein and made a part of this specification.

TECHNICAL FIELD

The disclosure relates to a detection circuit, and more particularly, to an abnormal detection circuit for detecting a three-phase alternating current (AC) power.

BACKGROUND

The three-phase AC power is more common in the use of power systems. The three-phase AC power generally uses a three-phase power system for higher load output requirements or equipment such as motors and generators. The three-phase AC power presents a three-phase balanced state under normal conditions. The balanced state means that the three-phase voltages of the three-phase AC power are the same as each other, and the phases of the three-phase AC power are 120° out of phase with each other.

When at least one voltage of the three-phase AC power is abnormal, such as an over voltage, an under voltage, or a phase loss (zero voltage), the three-phase AC power is unbalanced. The above-mentioned unbalance causes the current unbalance between the loads, shortens the life of the instrument, and overheats or even burns the instrument and causes fire and other hazards. Therefore, how to provide an abnormal detection circuit capable of instantly detecting the abnormality of each phase of the three-phase AC power is one of the research focuses of those skilled in the art.

SUMMARY

The disclosure provides an abnormal detection circuit for detecting a three-phase alternating current (AC) power, which can instantly detect the abnormality of each phase of the three-phase AC power.

The abnormal detection circuit of the disclosure includes a conversion circuit, a voltage detection circuit, and a warning circuit. The conversion circuit receives a three-phase AC power and converts the three-phase AC power into a driving power. The voltage detection circuit is coupled to the three-phase AC power and the conversion circuit. The voltage detection circuit detects each phase of the three-phase AC power. When a voltage value of at least one phase AC power of the three-phase AC power is detected to be abnormal, the voltage detection circuit uses the driving power to output at least one control signal corresponding to the abnormality. The warning circuit is coupled to the voltage detection circuit and the conversion circuit. The warning circuit is driven by receiving the driving power and outputs at least one warning signal corresponding to the abnormality in response to the at least one control signal.

Based on the above, the voltage detection circuit detects each phase of the three-phase AC power. When a voltage value of at least one phase AC power is abnormal, the voltage detection circuit uses the driving power to output at least one control signal corresponding to the abnormality. The warning circuit outputs at least one warning signal corresponding to the abnormality in response to the at least one control signal. In this way, the abnormal detection circuit can instantly detect the abnormality of each phase AC power in the three-phase AC power. In addition, the conversion circuit of the abnormal detection circuit converts the three-phase AC power into the driving power. Therefore, once connected to the three-phase AC power, the abnormal detection circuit may independently detect the three-phase AC power.

In order to make the aforementioned features and advantages of the disclosure comprehensible, embodiments accompanied with drawings are described in detail as follows.

DESCRIPTION OF THE EMBODIMENTS

Figure 1:
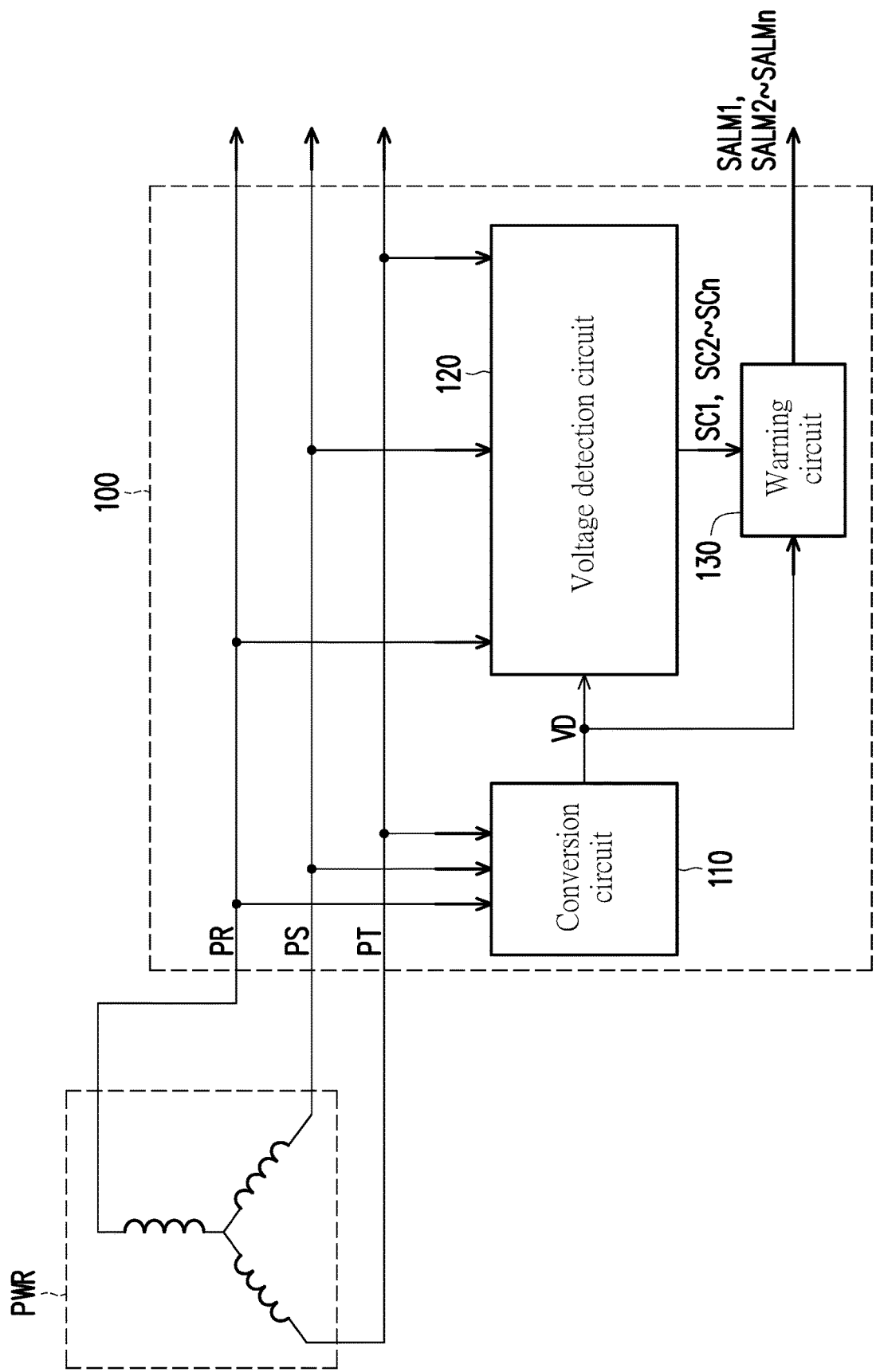
FIG. 1 is a schematic diagram of an abnormal detection circuit according to an embodiment of the disclosure.

Some embodiments of the disclosure accompanied with drawings are described in detail as follows. The reference numerals used in the following description are regarded as the same or similar elements when the same reference numerals appear in different drawings. These embodiments are only a part of the disclosure, and do not disclose all the possible implementations of the disclosure. To be more precise, the embodiments are only examples in the scope of the claims of the disclosure.

Please refer to FIG. 1, which is a schematic diagram of an abnormal detection circuit according to an embodiment of the disclosure. In the embodiment, an abnormal detection circuit 100 includes a conversion circuit 110, a voltage detection circuit 120, and a warning circuit 130. The conversion circuit 110 receives a three-phase alternating current (AC) power PWR. The conversion circuit 110 converts the three-phase AC power PWR into a driving power VD. Taking the embodiment as an example, the three-phase AC power PWR includes a first phase AC power PR, a second phase AC power PS, and a third phase AC power PT. The conversion circuit 110 converts the first phase AC power PR, the second phase AC power PS, and the third phase AC power PT together into the driving power VD.

The voltage detection circuit 120 is coupled to the three-phase AC power PWR and the conversion circuit 110. The voltage detection circuit 120 detects each phase of the three-phase AC power PWR. When a voltage value of at least one phase AC power of the three-phase AC power PWR is detected to be abnormal, the voltage detection circuit 120 uses the driving power VD to output at least one of control signals SC1 to SCn corresponding to the abnormality. Taking the embodiment as an example, the abnormality is one of an under voltage and an over voltage. When the over voltage is detected to occur in the first phase AC power PR, the voltage detection circuit 120 uses the driving power VD to output the control signal SC1. When the under voltage is detected to occur in the first phase AC power PR, the voltage detection circuit 120 uses the driving power VD to output the control signal SC2, and so on.

The warning circuit 130 is coupled to the voltage detection circuit 120 and the conversion circuit 110. The warning circuit 130 is driven by receiving the driving power VD. The warning circuit 130 outputs at least one of warning signals SALM1 to SALMn corresponding to the abnormality in response to the at least one control signal received. Taking the embodiment as an example, the warning circuit 130 outputs the warning signal SALM1 corresponding to the abnormality of the over voltage occurred in the first phase AC power PR in response to the control signal SC1. The warning circuit 130 outputs the warning signal SALM2 corresponding to the abnormality of the under voltage occurred in the first phase AC power PR in response to the control signal SC2, and so on.

It is worth mentioning here that the voltage detection circuit 120 detects each phase of the three-phase AC power PWR. When a voltage value of at least one phase AC power is abnormal, the voltage detection circuit 120 uses the driving power VD to output at least one control signal corresponding to the abnormality. The warning circuit 130 outputs a warning signal in response to the control signal received. In this way, the abnormal detection circuit 100 can instantly detect the abnormality of each phase AC power in the three-phase AC power.

In addition, the conversion circuit 110 of the abnormal detection circuit 100 converts the three-phase AC power PWR into the driving power VD. Therefore, once connected to the three-phase AC power PWR, the abnormal detection circuit 100 may independently detect the abnormality of the three-phase AC power PWR.

In the embodiment, the warning signals SALM1 to SALMn are different warning lights, respectively. For example, the emitting colors or color temperatures of the warning signals SALM1 to SALMn are different from each other. In this way, based on the warning signals SALM1 to SALMn, a user may intuitively determine whether the over voltage or the under voltage occurs in each phase of the three-phase AC power.

Figure 2:
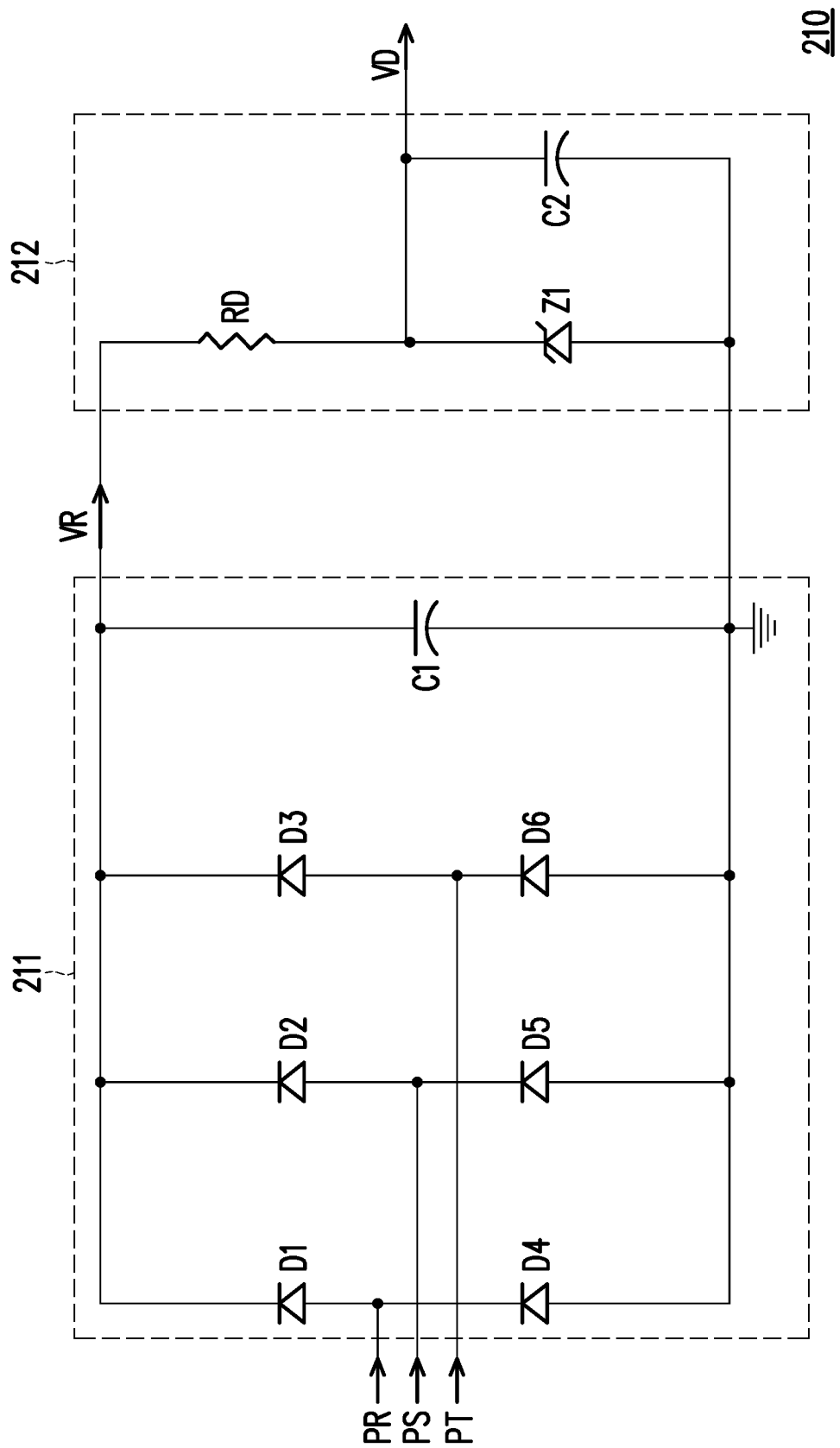
FIG. 2 is a schematic circuit diagram of a conversion circuit according to an embodiment of the disclosure.

Please refer to FIG. 2, which is a schematic circuit diagram of a conversion circuit according to an embodiment of the disclosure. In the embodiment, a conversion circuit 210 includes a power rectifier circuit 211 and a step-down circuit 212. The power rectifier circuit 211 receives the first phase AC power PR, the second phase AC power PS, and the third phase AC power PT, and converts the first phase AC power PR, the second phase AC power PS, and the third phase AC power PT together into a rectified power VR. The step-down circuit 212 is coupled to the power rectifier circuit 211. The step-down circuit 212 steps down the rectified power VR to generate the driving power VD.

The power rectifier circuit 211 includes rectifier diodes D1 to D6 and a rectifier capacitor C1. The anode of the rectifier diode D1 receives the first phase AC power PR. The cathode of the rectifier diode D1 is coupled to a first end of the rectifier capacitor C1. The anode of the rectifier diode D2 receives the second phase AC power PS. The cathode of the rectifier diode D2 is coupled to the first end of the rectifier capacitor C1. The anode of the rectifier diode D3 receives the third phase AC power PT. The cathode of the rectifier diode D3 is coupled to the first end of the rectifier capacitor C1. The cathode of the rectifier diode D4 receives the first phase AC power PR. The anode of the rectifier diode D4 is coupled to a second end of the rectifier capacitor C1. The cathode of the rectifier diode D5 receives the second phase AC power PS. The anode of the rectifier diode D5 is coupled to the second end of the rectifier capacitor C1. The cathode of the rectifier diode D6 receives the third phase AC power PT. The anode of the rectifier diode D6 is coupled to the second end of the rectifier capacitor C1. In the embodiment, the first end of the rectifier capacitor C1 is configured to output the rectified power VR. The second end of the rectifier capacitor C1 is coupled to a reference low voltage (e.g., ground).

The step-down circuit 212 includes a step-down resistor RD, a Zener diode Z1, and a voltage-stabilizing capacitor C2. A first end of the step-down resistor RD receives the rectified power VR. A second end of the step-down resistor RD serves as an output end of the conversion circuit 210. The cathode of the Zener diode Z1 is coupled to the second end of the step-down resistor RD. The anode of the Zener diode Z1 is coupled to the reference low voltage. The voltage-stabilizing capacitor C2 is coupled between the second end of the step-down resistor RD and the reference low voltage.

Figure 3:
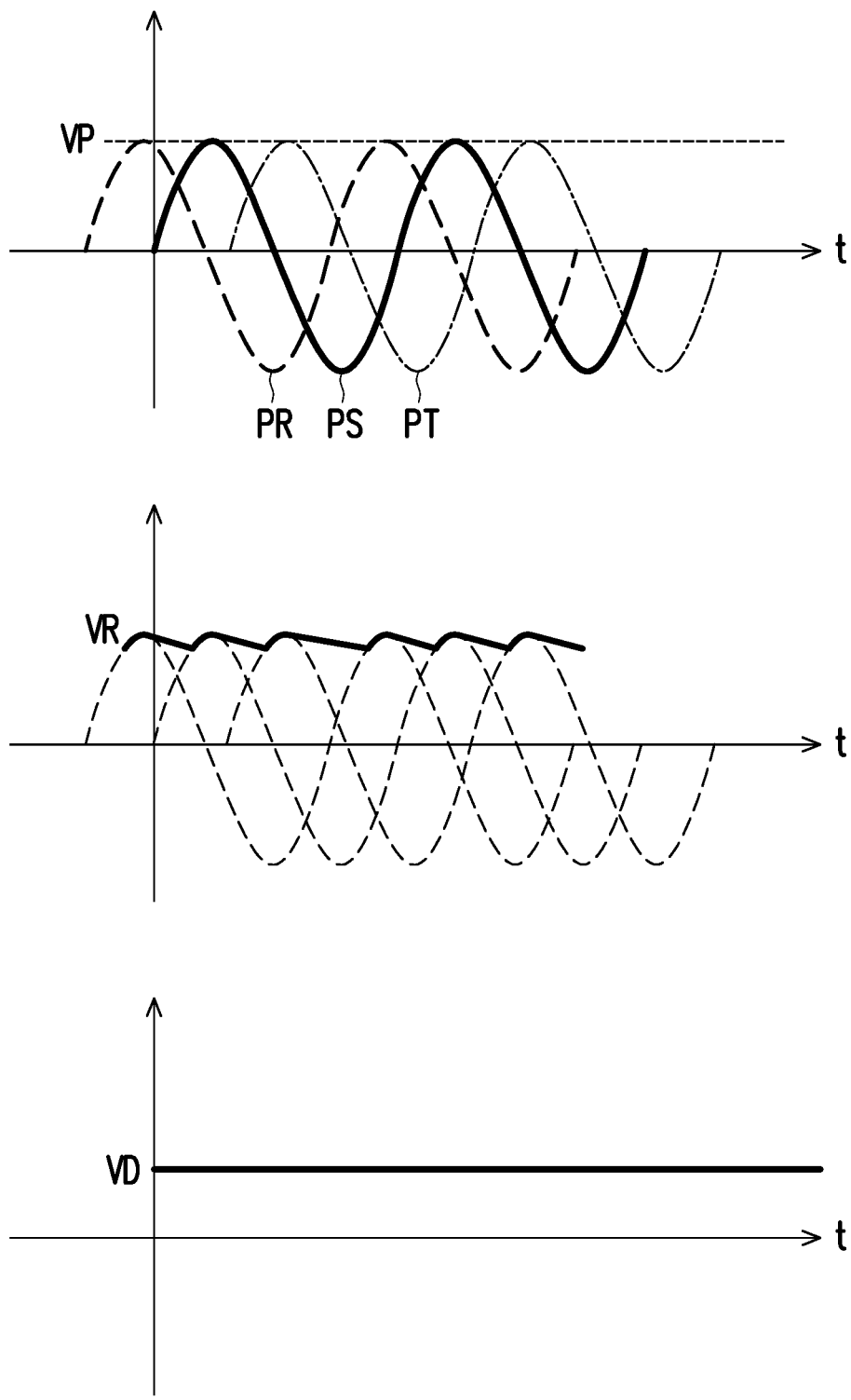
FIG. 3 is a waveform diagram of a three-phase AC power, a rectified power, and a driving power according to an embodiment of the disclosure.

Please refer to FIGS. 2 and 3 at the same time. FIG. 3 is a waveform diagram of a three-phase AC power, a rectified power, and a driving power according to an embodiment of the disclosure. FIG. 3 shows the voltage waveforms of the first phase AC power PR, the second phase AC power PS, the third phase AC power PT, the rectified power VR, and the driving power VD. In the embodiment, the power rectifier circuit 211 converts the first phase AC power PR, the second phase AC power PS, and the third phase AC power PT together into the rectified power VR. Therefore, the rectified power VR may be regarded as a direct current (DC) power with pulsation. The average value of the pulsating voltage peak values of the rectified power VR is close to or substantially equal to voltage peak values VP of the first phase AC power PR, the second phase AC power PS, and the third phase AC power PT in the balanced state. When the first phase AC power PR, the second phase AC power PS, and the third phase AC power PT are abnormal, the pulsating voltage peak values of the rectified power VR may fluctuate.

The step-down circuit 212 steps down the rectified power VR to generate the driving power VD. The voltage value of the driving power VD is determined by a reverse bias voltage value of the Zener diode Z1. In the embodiment, the voltage value of the driving power VD is substantially equal to the reverse bias voltage value of the Zener diode Z1. The voltage value of the driving power VD is significantly smaller than the voltage peak value VP or the pulsating voltage peak value of the rectified power VR. Therefore, even if at least one of the first phase AC power PR, the second phase AC power PS, and the third phase AC power PT is under-voltage, the driving power VD is substantially equal to the reverse bias voltage value of the Zener diode Z1.

Figure 4:
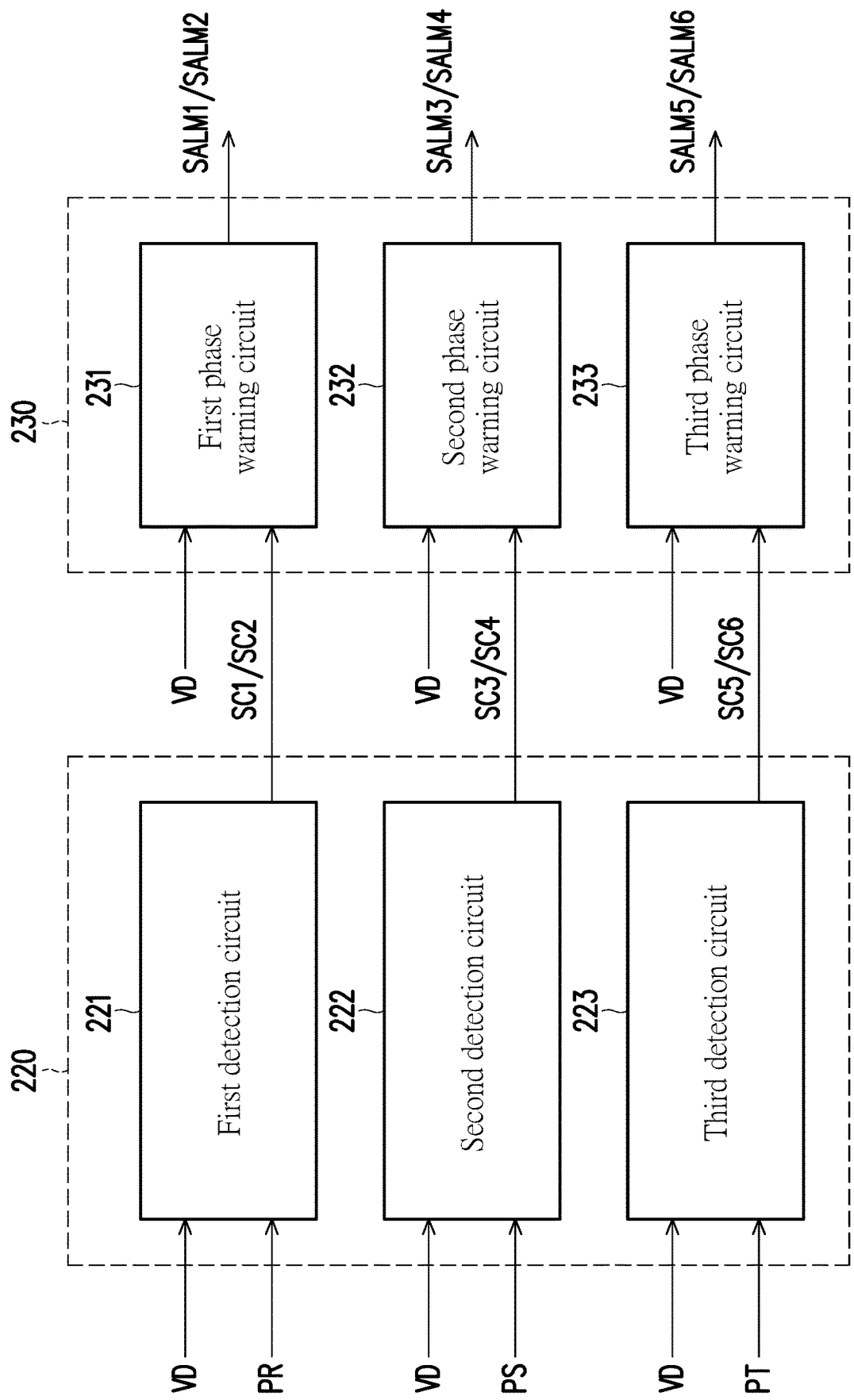
FIG. 4 is a schematic diagram of a voltage detection circuit and a warning circuit according to an embodiment of the disclosure.

Please refer to FIG. 4, which is a schematic diagram of a voltage detection circuit and a warning circuit according to an embodiment of the disclosure. In the embodiment, a voltage detection circuit 220 includes a first detection circuit 221, a second detection circuit 222, and a third detection circuit 223. The first detection circuit 221 receives the first phase AC power PR and the driving power VD. The first detection circuit 221 detects the first phase AC power PR. When the abnormality is detected in the voltage value of the first phase AC power PR, the first detection circuit 221 uses the driving power VD to output one of the control signal SC1 (or referred to as a first phase over voltage control signal) and the control signal SC2 (or referred to as a first phase under voltage control signal) corresponding to the abnormality. When the voltage value of the first phase AC power PR is detected to be over-voltage, the first detection circuit 221 uses the driving power VD to output the control signal SC1. When the voltage value of the first phase AC power PR is detected to be under-voltage, the first detection circuit 221 uses the driving power VD to output the control signal SC2. When the voltage value of the first phase AC power PR is detected not to be over-voltage and under-voltage, the first detection circuit 221 does not output the control signal SC1 and the control signal SC2.

The second detection circuit 222 receives the second phase AC power PS and the driving power VD. The second detection circuit 222 detects the second phase AC power PS. When the abnormality is detected in the voltage value of the second phase AC power PS, the second detection circuit 222 uses the driving power VD to output one of the control signal SC3 (or referred to as a second phase over voltage control signal) and the control signal SC4 (or referred to as a second phase under voltage control signal) corresponding to the abnormality. When the voltage value of the second phase AC power PS is detected to be over-voltage, the second detection circuit 222 uses the driving power VD to output the control signal SC3. When the voltage value of the second phase AC power PS is detected to be under-voltage, the second detection circuit 222 uses the driving power VD to output the control signal SC4. When the voltage value of the second phase AC power PS is detected not to be over-voltage and under-voltage, the second detection circuit 222 does not output the control signal SC3 and the control signal SC4.

The third detection circuit 223 receives the third phase AC power PT and the driving power VD. The third detection circuit 223 detects the third phase AC power PT. When the abnormality is detected in the voltage value of the third phase AC power PT, the third detection circuit 223 uses the driving power VD to output one of the control signal SC5 (or referred to as a third phase over voltage control signal) and the control signal SC6 (or referred to as a third phase under voltage control signal) corresponding to the abnormality. When the voltage value of the third phase AC power PT is detected to be over-voltage, the third detection circuit 223 uses the driving power VD to output the control signal SC5. When the voltage value of the third phase AC power PT is detected to be under-voltage, the third detection circuit 223 uses the driving power VD to output the control signal SC6. When the voltage value of the third phase AC power PT is detected not to be over-voltage and under-voltage, the third detection circuit 223 does not output the control signal SC5 and the control signal SC6.

In the embodiment, the warning circuit 230 includes a first phase warning circuit 231, a second phase warning circuit 232, and a third phase warning circuit 233. The first phase warning circuit 231 is coupled to the first detection circuit 221. The first phase warning circuit 231 is driven by receiving the driving power VD. The first phase warning circuit 231 provides the warning signal SALM1 (or referred to as a first phase over voltage warning signal) in response to the control signal SC1. The first phase warning circuit 231 provides the warning signal SALM2 (or referred to as a first phase under voltage warning signal) in response to the control signal SC2.

The second phase warning circuit 232 is coupled to the second detection circuit 222. The second phase warning circuit 232 is driven by receiving the driving power VD. The second phase warning circuit 232 provides the warning signal SALM3 (or referred to as a second phase over voltage warning signal) in response to the control signal SC3. The second phase warning circuit 232 provides the warning signal SALM4 (or referred to as a second phase under voltage warning signal) in response to the control signal SC4.

The third phase warning circuit 233 is coupled to the third detection circuit 223. The third phase warning circuit 233 is driven by receiving the driving power VD. The third phase warning circuit 233 provides the warning signal SALM5 (or referred to as a third phase over voltage warning signal) in response to the control signal SC5. The third phase warning circuit 233 provides the warning signal SALM6 (or referred to as a third phase under voltage warning signal) in response to the control signal SC6.

Figure 5:
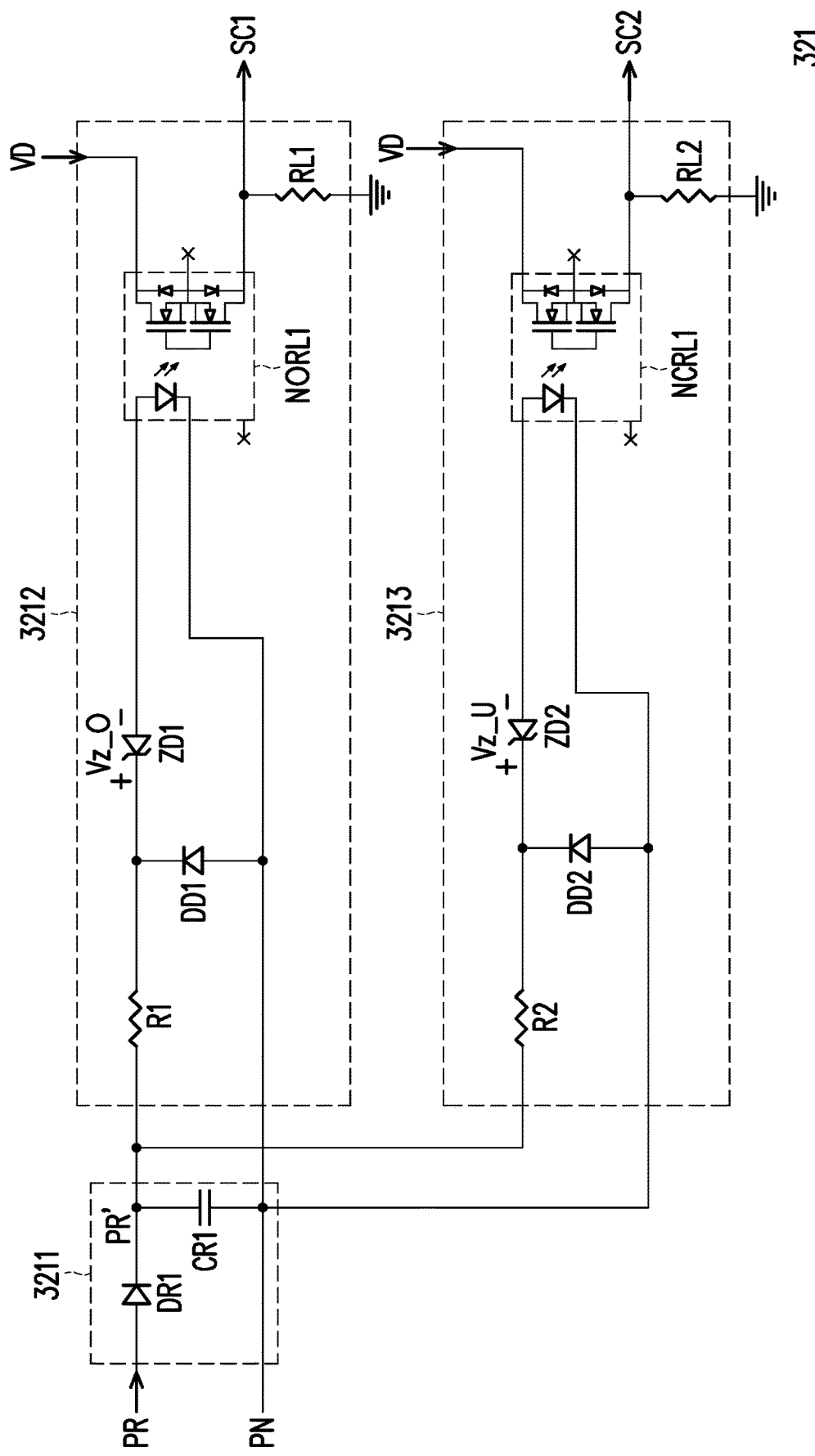
FIG. 5 is a schematic circuit diagram of a first detection circuit according to an embodiment of the disclosure.

Please refer to FIG. 5, which is a schematic circuit diagram of a first detection circuit according to an embodiment of the disclosure. In the embodiment, a first detection circuit 321 includes a rectifier circuit 3211, an over voltage detection circuit 3212, and an under voltage detection circuit 3213. The rectifier circuit 3211 rectifies the first phase AC power PR to generate a rectified first phase power PR'. In the embodiment, the voltage peak value of the first phase AC power PR may be maintained by the rectified first phase power PR'. The over voltage detection circuit 3212 is coupled to the rectifier circuit 3211. The over voltage detection circuit 3212 detects whether the voltage value of the rectified first phase power PR' is over-voltage. When the voltage value of the rectified first phase power PR' is over-voltage, it means that the voltage value of the first phase AC power PR is over-voltage. Therefore, the over voltage detection circuit 3212 uses the driving power VD to output the control signal SC1. The under voltage detection circuit 3213 is coupled to the rectifier circuit 3211. The under voltage detection circuit 3213 detects whether the voltage value of the rectified first phase power PR' is under-voltage. When the voltage value of the rectified first phase power PR' is under-voltage, it means that the voltage value of the first phase AC power PR is under-voltage. Therefore, the under voltage detection circuit 3213 uses the driving power VD to output the control signal SC2.

Taking the embodiment as an example, the rectifier circuit 3211 includes a rectifier diode DR1 and a rectifier capacitor CR1. The anode of the rectifier diode DR1 receives the first phase AC power PR. The anode of the rectifier diode DR1 serves as an output end of the rectifier circuit 3211. A first end of the rectifier capacitor CR1 is coupled to the cathode of the rectifier diode DR1. A second end of the rectifier capacitor CR1 is coupled to a neutral point PN of the three-phase AC power (the three-phase AC power PWR shown in FIG. 1). In some embodiments, the second end of the rectifier capacitor CR1 is coupled to the reference low voltage.

The over voltage detection circuit 3212 includes a Zener diode ZD1, a normal open relay NORL1, and a level resistor RL1. The cathode of the Zener diode ZD1 is coupled to the output end of the rectifier circuit 3211. The cathode of the Zener diode ZD1 is coupled to the cathode of the rectifier diode DR1 to receive the rectified first phase power PR'. A first control end of the normal open relay NORL1 is coupled to the anode of the Zener diode ZD1. A second control end of the normal open relay NORL1 is coupled to the second end of the rectifier capacitor CR1. A first signal end of the normal open relay NORL1 receives the driving power VD. A second signal end of the normal open relay NORL1 serves as an output end of the over voltage detection circuit 3212. The level resistor RL1 is coupled between the second signal end of the normal open relay NORL1 and the reference low voltage.

The normal voltage peak range of the first phase AC power PR is set to, for example, 127 volts to 170 volts. A reverse bias voltage value Vz_O of the Zener diode ZD1 is designed to be greater than the upper limit (e.g., 170 volts) of the normal voltage peak range of the first phase AC power PR. The reverse bias voltage value Vz_O of the Zener diode ZD1 is designed to be 180 volts (the disclosure is not limited thereto). When the voltage value of the rectified first phase power PR' is greater than the reverse bias voltage value Vz_O of the Zener diode ZD1, the normal open relay NORL1 is turned on. Therefore, the driving power VD is served as the control signal SC1. In addition, the level resistor RL1 is configured to maintain the voltage level of the control signal SC1. On the other hand, when the voltage value of the rectified first phase power is smaller than or equal to the reverse bias voltage value Vz_O of the Zener diode ZD1, the normal open relay NORL1 is turned off to be in an initial normal open state. In addition, the level resistor RL1 pulls down the voltage level at the second signal end of the normal open relay NORL1 to the reference low voltage.

The under voltage detection circuit 3213 includes a Zener diode ZD2, a normal close relay NCRL1, and a level resistor RL2. The cathode of the Zener diode ZD2 is coupled to the output end of the rectifier circuit 3211. The cathode of the Zener diode ZD2 is coupled to the cathode of the rectifier diode DR1 to receive the rectified first phase power PR'. A first control end of the normal close relay NCRL1 is coupled to the anode of the Zener diode ZD2. A second control end of the normal close relay NCRL1 is coupled to the second end of the rectifier capacitor CR1. A first signal end of the normal close relay NCRL1 receives the driving power VD. A second signal end of the normal close relay NCRL1 serves as an output end of the under voltage detection circuit 3213. The level resistor RL2 is coupled between the second signal end of the normal close relay NCRL1 and the reference low voltage.

A reverse bias voltage value Vz_U of the Zener diode ZD2 is smaller than the reverse bias voltage value Vz_O of the Zener diode ZD1. The reverse bias voltage value Vz_U of the Zener diode ZD2 is designed to be smaller than the lower limit (e.g., 127 volts) of the normal voltage peak range of the first phase AC power PR. The reverse bias voltage value Vz_U of the Zener diode ZD2 is designed to be 120 volts (the disclosure is not limited thereto). When the voltage value of the rectified first phase power PR' is smaller than or equal to the reverse bias voltage value Vz_U of the Zener diode ZD2, the normal close relay NCRL1 is turned on to be in an initial normal close state. Therefore, the normal close relay NCRL1 uses the driving power VD as the control signal SC2. In addition, the level resistor RL2 maintains the voltage level of the control signal SC2. On the other hand, when the voltage value of the rectified first phase power PR' is greater than the reverse bias voltage value Vz_U of the Zener diode ZD2, the normal close relay NCRL1 is turned off. In addition, the level resistor RL2 pulls down the voltage level at the second signal end of the normal close relay NCRL1 to the reference low voltage.

Incidentally, the first detection circuit 321 uses the reverse bias voltage value Vz_O of the Zener diode ZD1 and the reverse bias voltage value Vz_U of the Zener diode ZD2 to detect whether the first phase AC power PR is abnormal. The first detection circuit 321 does not need to use an algorithm, an arithmetic circuit, or a comparator to determine whether the first phase AC power PR is abnormal. Therefore, the first detection circuit 321 can instantly detect the result. In addition, the design cost of the first detection circuit 321 can be greatly reduced.

In the embodiment, the over voltage detection circuit 3212 further includes a resistor R1 and a diode DD1. The resistor R1 is coupled between the cathode of the rectifier diode DR1 and the cathode of the Zener diode ZD1. The cathode of the diode DD1 is coupled to the cathode of the Zener diode ZD1. The anode of the diode DD1 is coupled to the second end of the rectifier capacitor CR1. The under voltage detection circuit 3213 further includes a resistor R2 and a diode DD2. The resistor R2 is coupled between the cathode of the rectifier diode DR1 and the cathode of the Zener diode ZD2. The cathode of the diode DD2 is coupled to the cathode of the Zener diode ZD2. The anode of the diode DD2 is coupled to the second end of the rectifier capacitor CR1. The diode DD1 and the diode DD2 may be omitted based on design requirements.

In some embodiments, the reverse bias voltage value Vz_O may be provided by multiple Zener diodes ZD1 connected in series. The reverse bias voltage value Vz_U may be provided by multiple Zener diodes ZD2 connected in series.

In the embodiment, the normal open relay NORL1 and the normal close relay NCRL1 may be implemented by transistor-type relays, respectively. The transistor-type relay includes a light-emitting diode and at least one transistor switch.

In the normal open relay NORL1, when the light-emitting diode emits light, the transistor switch is turned on. When the light-emitting diode is not emitting light, the transistor switch is turned off.

In the normal close relay NCRL1, when the light-emitting diode emits light, the transistor switch is turned off. When the light-emitting diode is not emitting light, the transistor switch is turned on.

Figure 6:
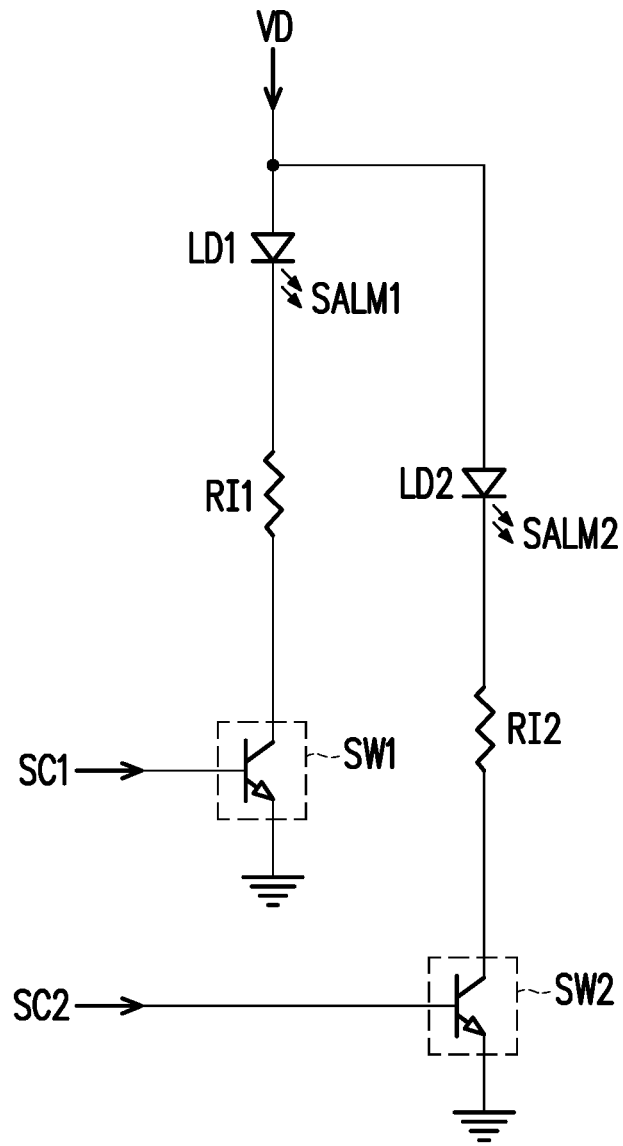
FIG. 6 is a schematic diagram of a first phase warning circuit according to an embodiment of the disclosure.

Please refer to FIGS. 5 and 6. FIG. 6 is a schematic diagram of a first phase warning circuit according to an embodiment of the disclosure. In the embodiment, a first phase warning circuit 331 includes light-emitting elements LD1 and LD2 and switches SW1 and SW2. The switch SW1 and the light-emitting element LD1 are coupled in series between the driving power VD and the reference low voltage. The switch SW1 is turned on in response to the control signal SC1. Therefore, the light-emitting element LD1 outputs the warning signal SALM1. Taking the embodiment as an example, the light-emitting element LD1 is a light-emitting diode (LED) in any form. The switch SW1 is implemented by, for example, a transistor. The anode of the light-emitting element LD1 is coupled to the driving power VD. A first end of the switch SW1 is coupled to the cathode of the light-emitting element LD1. A second end of the switch SW1 is coupled to the reference low voltage. A control end of the switch SW1 is coupled to the over voltage detection circuit 3212. When the control end of the switch SW1 receives the control signal SC1, the switch SW1 is turned on to generate a power path of the driving power VD. Therefore, the light-emitting element LD1 outputs the warning signal SALM1.

The switch SW2 and the light-emitting element LD2 are coupled in series between the driving power VD and the reference low voltage. The switch SW2 is turned on in response to the control signal SC2. Therefore, the light-emitting element LD2 outputs the warning signal SALM2. Taking the embodiment as an example, the light-emitting element LD2 is a light-emitting diode of any form. The switch SW2 is implemented by, for example, a transistor. The anode of the light-emitting element LD2 is coupled to the driving power VD. A first end of the switch SW2 is coupled to the cathode of the light-emitting element LD2. A second end of the switch SW2 is coupled to the reference low voltage. A control end of the switch SW2 is coupled to the under voltage detection circuit 3213. When the control end of the switch SW2 receives the control signal SC2, the switch SW2 is turned on to generate the power path of the driving power VD. Therefore, the light-emitting element LD2 outputs the warning signal SALM2.

In the embodiment, the switch SW1 and the switch SW2 are implemented by NPN bipolar transistors (BJTs), respectively. However, the disclosure is not limited thereto. In some embodiments, the switch SW1 and the switch SW2 may be implemented by any type of N-type field-effect transistor (FET) or transmission gate, respectively.

In the embodiment, the first phase warning circuit further includes resistors RI1 and RI2. The resistor RI1 is coupled between the cathode of the light-emitting element LD1 and the first end of the switch SW1. The resistor RI2 is coupled between the cathode of the light-emitting element LD2 and the first end of the switch SW2. The resistor RI1 and the resistor RI2 are configured to limit the power path of the driving power VD, so as to protect the light-emitting element LD1 and the light-emitting element LD2 and the switch SW1 and the switch SW2 from being damaged by a high current.

Figure 7:
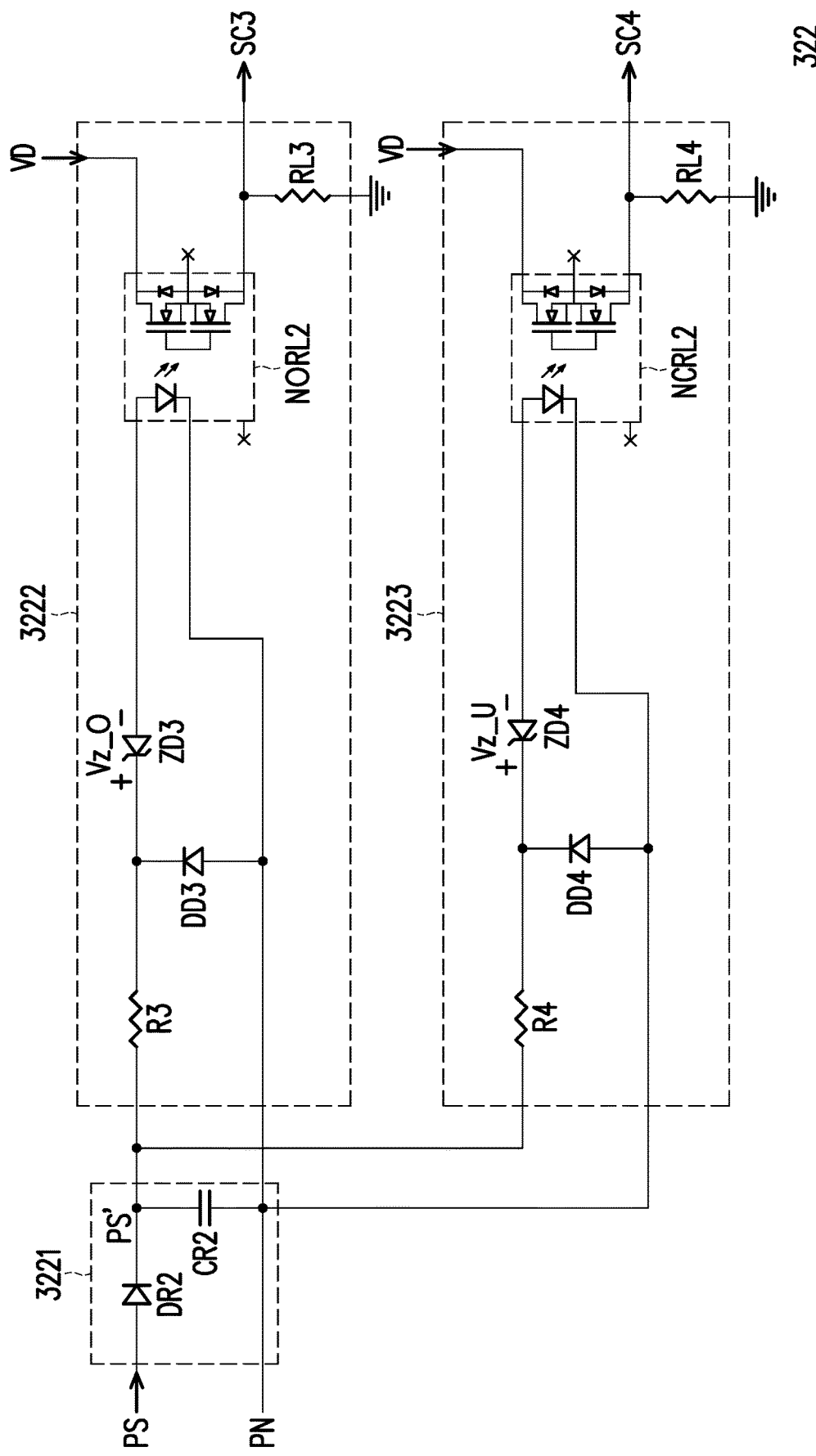
FIG. 7 is a schematic circuit diagram of a second detection circuit according to an embodiment of the disclosure.

Please refer to FIG. 7, which is a schematic circuit diagram of a second detection circuit according to an embodiment of the disclosure. In the embodiment, a second detection circuit 322 includes a rectifier circuit 3221, an over voltage detection circuit 3222, and an under voltage detection circuit 3223. The rectifier circuit 3221 rectifies the second phase AC power PS to generate a rectified second phase power PS'. In the embodiment, the voltage peak value of the second phase AC power PS may be maintained by the rectified second phase power PS'. The over voltage detection circuit 3222 is coupled to the rectifier circuit 3221. The over voltage detection circuit 3222 detects whether the voltage value of the rectified second phase power PS' is over-voltage. When the voltage value of the rectified second phase power PS' is over-voltage, the over voltage detection circuit 3222 uses the driving power VD to output the control signal SC3. The under voltage detection circuit 3223 is coupled to the rectifier circuit 3221. The under voltage detection circuit 3223 detects whether the voltage value of the rectified second phase power PS' is under-voltage. When the voltage value of the rectified second phase power PS' is under-voltage, the under voltage detection circuit 3223 uses the driving power VD to output the control signal SC4.

Taking the embodiment as an example, the rectifier circuit 3221 includes a rectifier diode DR2 and a rectifier capacitor CR2. The anode of the rectifier diode DR2 receives the second phase AC power PS. The anode of the rectifier diode DR2 serves as an output end of the rectifier circuit 3221. A first end of the rectifier capacitor CR2 is coupled to the cathode of the rectifier diode DR2. A second end of the rectifier capacitor CR2 is coupled to the neutral point PN of the three-phase AC power.

The over voltage detection circuit 3222 includes a Zener diode ZD3, a normal open relay NORL2, a level resistor RL3, a resistor R3, and a diode DD3. The resistor R3 is coupled between the cathode of the rectifier diode DR2 and the cathode of the Zener diode ZD3. The cathode of the diode DD3 is coupled to the cathode of the Zener diode ZD3. The anode of the diode DD3 is coupled to the second end of the rectifier capacitor CR2. A first control end of the normal open relay NORL2 is coupled to the anode of the Zener diode ZD3. A second control end of the normal open relay NORL2 is coupled to the second end of the rectifier capacitor CR2. A first signal end of the normal open relay NORL2 receives the driving power VD. A second signal end of the normal open relay NORL2 serves as an output end of the over voltage detection circuit 3222. The level resistor RL3 is coupled between the second signal end of the normal open relay NORL2 and the reference low voltage.

The reverse bias voltage value Vz_O of the Zener diode ZD3 is designed to be greater than the upper limit of the normal voltage peak range of the second phase AC power PS. When the voltage value of the rectified second phase power PS' is greater than the reverse bias voltage value Vz_O of the Zener diode ZD3, the normal open relay NORL2 is turned on to use the driving power VD as the control signal SC3. The level resistor RL3 maintains the voltage level of the control signal SC3. On the other hand, when the voltage value of the rectified second phase power PS' is smaller than or equal to the reverse bias voltage value Vz_O of the Zener diode ZD3, the normal open relay NORL2 is turned off. The level resistor RL3 pulls down the voltage level at the second signal end of the normal open relay NORL2 to the reference low voltage.

The under voltage detection circuit 3223 includes a Zener diode ZD4, a normal close relay NCRL2, a level resistor RL4, a resistor R4, and a diode DD4. The resistor R4 is coupled between the cathode of the rectifier diode DR2 and the cathode of the Zener diode ZD4. The cathode of the diode DD4 is coupled to the cathode of the Zener diode ZD4. The anode of the diode DD4 is coupled to the second end of the rectifier capacitor CR2. A first control end of the normal close relay NCRL2 is coupled to the anode of the Zener diode ZD4. A second control end of the normal close relay NCRL2 is coupled to the second end of the rectifier capacitor CR2. A first signal end of the normal close relay NCRL2 receives the driving power VD. A second signal end of the normal close relay NCRL2 serves as an output end of the under voltage detection circuit 3223. The level resistor RL4 is coupled between the second signal end of the normal close relay NCRL2 and the reference low voltage.

The reverse bias voltage value Vz_U of the Zener diode ZD4 is smaller than the reverse bias voltage value Vz_O of the Zener diode ZD3. The reverse bias voltage value Vz_U of the Zener diode ZD4 is designed to be smaller than the lower limit of the normal voltage peak range of the second phase AC power PS. When the voltage value of the rectified second phase power PS' is smaller than or equal to the reverse bias voltage value Vz_U of the Zener diode ZD4, the normal close relay NCRL2 is turned on to use the driving power VD as the control signal SC4. In addition, the level resistor RL4 is configured to maintain the voltage level of the control signal SC4. On the other hand, when the voltage value of the rectified second phase power PS' is greater than the reverse bias voltage value Vz_U of the Zener diode ZD4, the normal close relay NCRL2 is turned off. In addition, the level resistor RL4 pulls down the voltage level at the second signal end of the normal close relay NCRL2 to the reference low voltage.

The resistor R3, the resistor R4, the diode DD3, and the diode DD4 may be omitted based on design requirements. When the resistor R4 is omitted, the diode DD4 is connected to the resistor R3 and the end of the diode DD4.

Figure 8:
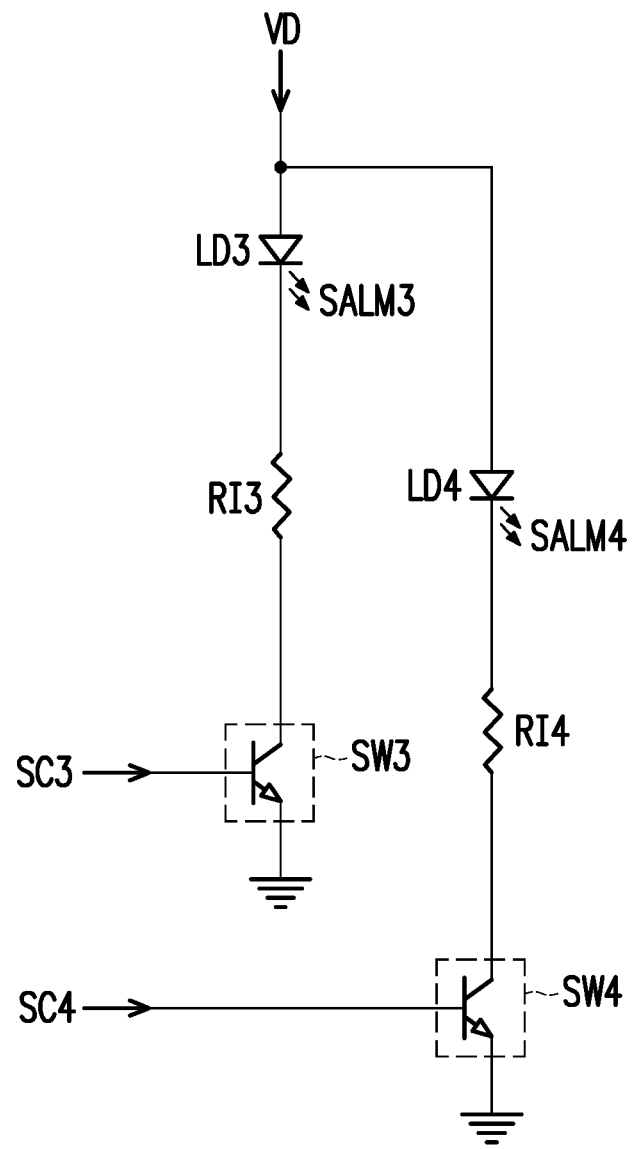
FIG. 8 is a schematic diagram of a second phase warning circuit according to an embodiment of the disclosure.

Please refer to FIGS. 7 and 8. FIG. 8 is a schematic diagram of a second phase warning circuit according to an embodiment of the disclosure. In the embodiment, a second phase warning circuit 332 includes light-emitting elements LD3 and LD4, switches SW3 and SW4, and resistors RI3 and RI4. The switch SW3, the resistor R13, and the light-emitting element LD3 are coupled in series between the driving power VD and the reference low voltage. The switch SW3 is turned on in response to the control signal SC3. Therefore, the light-emitting element LD3 outputs the warning signal SALM3. The switch SW4, the resistor RI4, and the light-emitting element LD4 are coupled in series between the driving power VD and the reference low voltage. The switch SW4 is turned on in response to the control signal SC4. Therefore, the light-emitting element LD4 outputs the warning signal SALM4.

Figure 9:
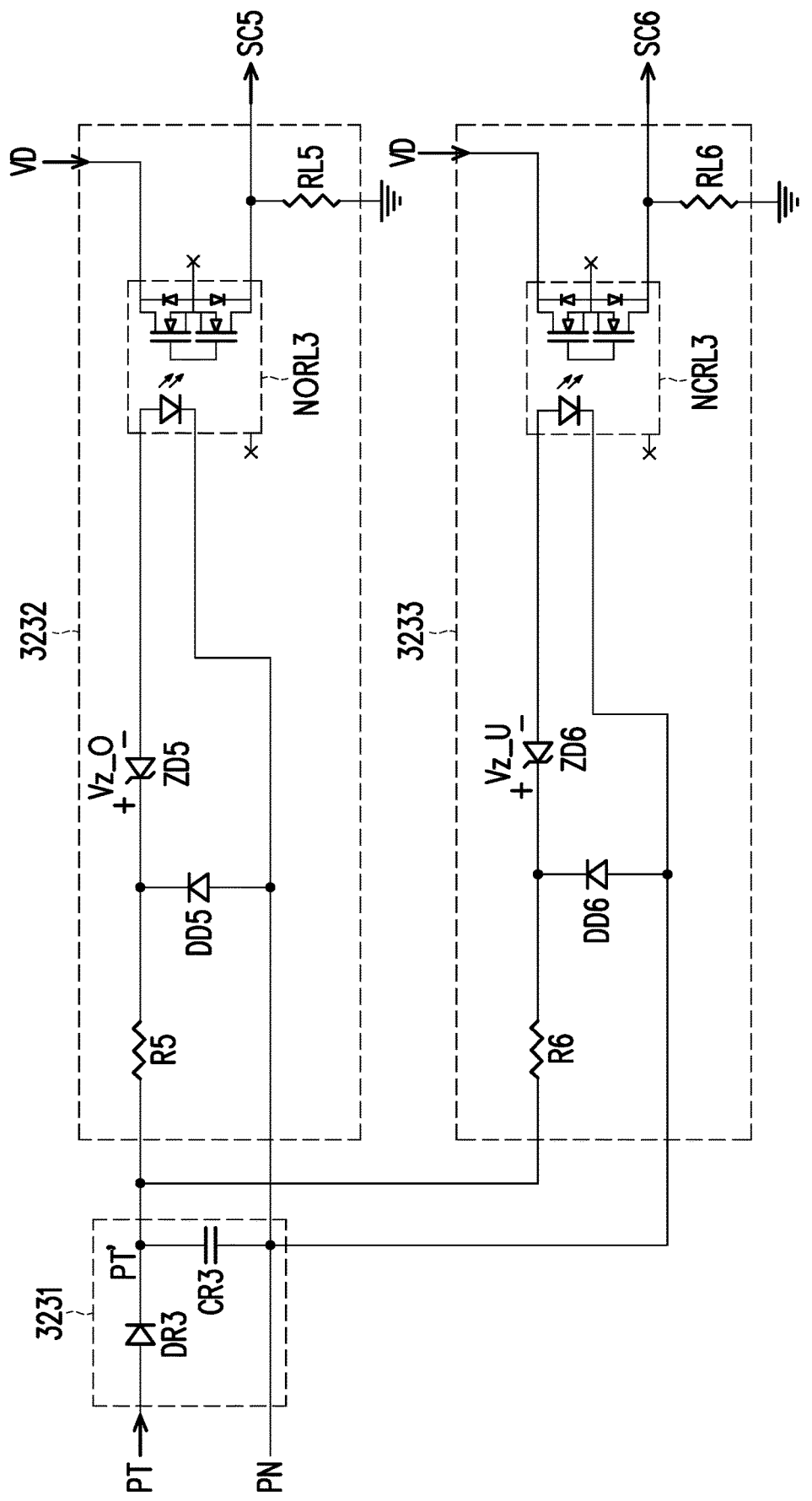
FIG. 9 is a schematic circuit diagram of a third detection circuit according to an embodiment of the disclosure.

Please refer to FIG. 9, which is a schematic circuit diagram of a third detection circuit according to an embodiment of the disclosure. In the embodiment, a third detection circuit 323 includes a rectifier circuit 3231, an over voltage detection circuit 3232, and an under voltage detection circuit 3233. The rectifier circuit 3231 rectifies the third phase AC power PT to generate a rectified third phase power PT'. In the embodiment, the voltage peak value of the third phase AC power PT may be maintained by the rectified third phase power PT'. The over voltage detection circuit 3232 is coupled to the rectifier circuit 3231. The over voltage detection circuit 3232 detects whether the voltage value of the rectified third phase power PT' is over-voltage. When the voltage value of the rectified third phase power PT' is over-voltage, the over voltage detection circuit 3232 uses the driving power VD to output the control signal SC5. The under voltage detection circuit 3233 is coupled to the rectifier circuit 3231. The under voltage detection circuit 3233 detects whether the voltage value of the rectified third phase power PT' is under-voltage. When the voltage value of the rectified third phase power PT' is under-voltage, the under voltage detection circuit 3233 uses the driving power VD to output the control signal SC6.

Taking the embodiment as an example, the rectifier circuit 3231 includes a rectifier diode DR3 and a rectifier capacitor CR3. The anode of the rectifier diode DR3 receives the third phase AC power PT. The anode of the rectifier diode DR3 serves as an output end of the rectifier circuit 3231. A first end of the rectifier capacitor CR3 is coupled to the cathode of the rectifier diode DR3. A second end of the rectifier capacitor CR3 is coupled to the neutral point PN of the three-phase AC power.

The over voltage detection circuit 3232 includes a Zener diode ZD5, a normal open relay NORL3, a level resistor RL5, a resistor R5, and a diode DD5. The resistor R5 is coupled between the cathode of the rectifier diode DR3 and the cathode of the Zener diode ZD5. The cathode of the diode DD5 is coupled to the cathode of the Zener diode ZD5. The anode of the diode DD5 is coupled to the second end of the rectifier capacitor CR3. A first control end of the normal open relay NORL3 is coupled to the anode of the Zener diode ZD5. A second control end of the normal open relay NORL3 is coupled to the second end of the rectifier capacitor CR3. A first signal end of the normal open relay NORL3 receives the driving power VD. A second signal end of the normal open relay NORL3 serves as an output end of the over voltage detection circuit 3232. The level resistor RL5 is coupled between the second signal end of the normal open relay NORL3 and the reference low voltage.

The reverse bias voltage value Vz_O of the Zener diode ZD5 is designed to be greater than the upper limit of the normal voltage peak range of the third phase AC power PT. When the voltage value of the rectified third phase power PT' is greater than the reverse bias voltage value Vz_O of the Zener diode ZD5, the normal open relay NORL3 is turned on to use the driving power VD as the control signal SC5. The level resistor RL5 maintains the voltage level of the control signal SC5. On the other hand, when the voltage value of the rectified third phase power PT' is smaller than or equal to the reverse bias voltage value Vz_O of the Zener diode ZD5, the normal open relay NORL3 is turned off. The level resistor RL5 pulls down the voltage level at the second signal end of the normal open relay NORL3 to the reference low voltage.

The under voltage detection circuit 3233 includes a Zener diode ZD6, a normal close relay NCRL3, a level resistor RL6, a resistor R6, and a diode DD6. The resistor R6 is coupled between the cathode of the rectifier diode DR3 and the cathode of the Zener diode ZD6. The cathode of the diode DD6 is coupled to the cathode of the Zener diode ZD6. The anode of the diode DD6 is coupled to the second end of the rectifier capacitor CR3. A first control end of the normal close relay NCRL3 is coupled to the anode of the Zener diode ZD6. A second control end of the normal close relay NCRL3 is coupled to the second end of the rectifier capacitor CR3. A first signal end of the normal close relay NCRL3 receives the driving power VD. A second signal end of the normal close relay NCRL3 serves as an output end of the under voltage detection circuit 3233. The level resistor RL6 is coupled between the second signal end of the normal close relay NCRL3 and the reference low voltage.

The reverse bias voltage value Vz_U of the Zener diode ZD6 is smaller than the reverse bias voltage value Vz_O of the Zener diode ZD5. The reverse bias voltage value Vz_U of the Zener diode ZD6 is designed to be smaller than the lower limit of the normal voltage peak range of the third phase AC power PT. When the voltage value of the rectified third phase power PT' is smaller than or equal to the reverse bias voltage value Vz_U of the Zener diode ZD6, the normal close relay NCRL3 is turned on to use the driving power VD as the control signal SC6. In addition, the level resistor RL6 maintains the voltage level of the control signal SC6. On the other hand, when the voltage value of the rectified third phase power PT' is greater than the reverse bias voltage value Vz_U of the Zener diode ZD6, the normal close relay NCRL3 is turned off. In addition, the level resistor RL6 pulls down the voltage level at the second signal end of the normal close relay NCRL3 to the reference low voltage.

The resistor R5, the resistor R6, the diode DD5, and the diode DD6 may be omitted based on design requirements. When the resistor R6 is omitted, the diode DD6 is connected to the resistor R5 and the end of the diode DD5.

Figure 10:
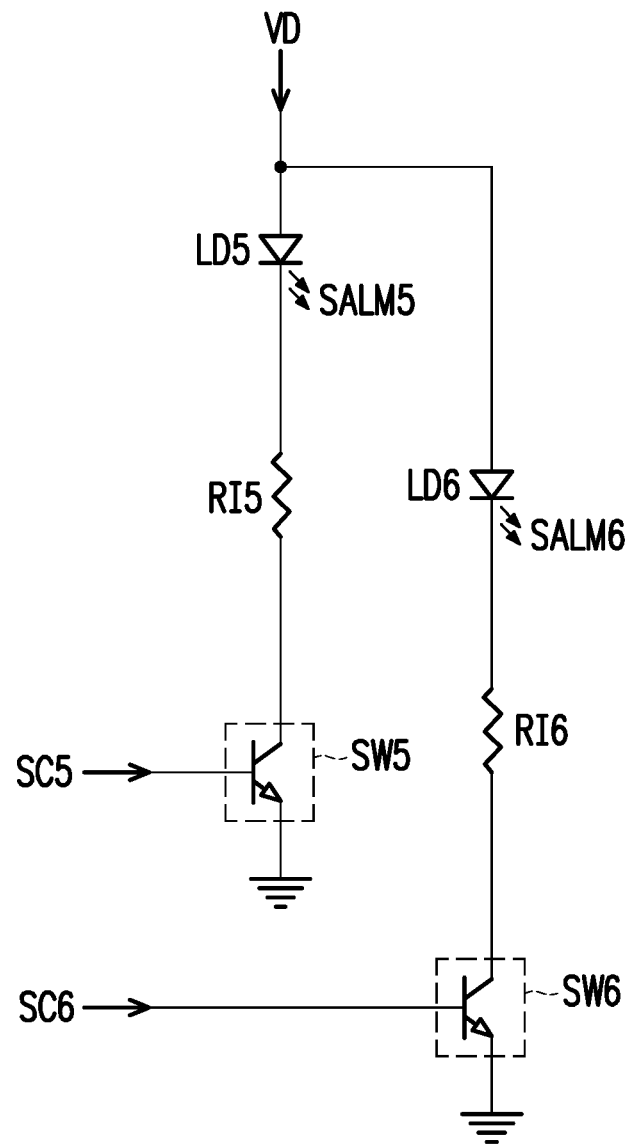
FIG. 10 is a schematic diagram of a third phase warning circuit according to an embodiment of the disclosure.

Please refer to FIGS. 9 and 10. FIG. 10 is a schematic diagram of a third phase warning circuit according to an embodiment of the disclosure. In the embodiment, a third phase warning circuit 333 includes light-emitting elements LD5 and LD6, switches SW5 and SW6, and resistors R15 and RI6. The switch SW5, the resistor RI5, and the light-emitting element LD5 are coupled in series between the driving power VD and the reference low voltage. The switch SW5 is turned on in response to the control signal SC5.

Therefore, the light-emitting element LD5 outputs the warning signal SALM5. The switch SW6, the resistor RI6, and the light-emitting element LD6 are coupled in series between the driving power VD and the reference low voltage. The switch SW6 is turned on in response to the control signal SC6. Therefore, the light-emitting element LD6 outputs the warning signal SALM6.

To sum up, the voltage detection circuit of the disclosure detects each phase of the three-phase AC power. When a voltage value of at least one phase AC power is abnormal, the voltage detection circuit uses the driving power to output at least one control signal corresponding to the abnormality. The warning circuit outputs a warning signal corresponding to the abnormality in response to the control signal received. In this way, the abnormal detection circuit can instantly detect the abnormality of each phase AC power in the three-phase AC power. The conversion circuit converts the three-phase AC power into the driving power. In this way, once connected to the three-phase AC power, the abnormal detection circuit may independently detect the abnormality of the three-phase AC power. In addition, the warning signals are different warning lights, respectively. The user can intuitively determine whether the over voltage or the under voltage occurs in each phase of the three-phase AC power.

Although the disclosure has been described with reference to the above embodiments, the described embodiments are not intended to limit the disclosure. People of ordinary skill in the art may make some changes and modifications without departing from the spirit and the scope of the disclosure. Thus, the scope of the disclosure shall be subject to those defined by the attached claims.

What is claimed is:

1. An abnormal detection circuit for detecting a three-phase alternating current (AC) power, comprising:
   a conversion circuit, configured to receive the three-phase AC power and convert the three-phase AC power into a driving power;
   a voltage detection circuit, coupled to the three-phase AC power and the conversion circuit, configured to detect each phase of the three-phase AC power, and when detecting abnormality occurs in a voltage value of at least one phase AC power of the three-phase AC power, using the driving power to output at least one control signal corresponding to the abnormality; and
   a warning circuit, coupled to the voltage detection circuit and the conversion circuit, configured to be driven by receiving the driving power, and outputting at least one warning signal corresponding to the abnormality in response to the at least one control signal,
   wherein the warning circuit comprises:
      a first phase warning circuit, configured to be driven by receiving the driving power, providing a first phase over voltage warning signal in response to a first phase over voltage control signal, and providing a first phase under voltage warning signal in response to a first phase under voltage control signal,
   wherein the first phase warning circuit comprises:
      a first switch, coupled between the driving power and a reference low voltage, and configured to be turned on in response to the first phase over voltage control signal, so as to enable the first phase over voltage warning signal; and
      a second switch, coupled between the driving power and the reference low voltage, and configured to be turned on in response to the first phase under voltage control signal, so as to enable the first phase under voltage warning signal.

2. The abnormal detection circuit according to claim 1, wherein the abnormality is one of an under voltage and an over voltage.

3. The abnormal detection circuit according to claim 1, wherein the conversion circuit comprises:
   a power rectifier circuit, configured to receive a first phase AC power, a second phase AC power, and a third phase AC power in the three-phase AC power, and converting the first phase AC power, the second phase AC power, and the third phase AC power together into a rectified power; and
   a step-down circuit, coupled to the power rectifier circuit, and configured to step down the rectified power to generate the driving power.

4. The abnormal detection circuit according to claim 3, wherein the step-down circuit comprises:
   a step-down resistor, a first end of the step-down resistor receiving the rectified power, and a second end of the step-down resistor serving as an output end of the conversion circuit;
   a Zener diode, a cathode of the Zener diode being coupled to the second end of the step-down resistor, and an anode of the Zener diode being coupled to a reference low voltage; and
   a voltage-stabilizing capacitor, coupled between the second end of the step-down resistor and the reference low voltage.

5. The abnormal detection circuit according to claim 4, wherein a voltage value of the driving power is determined by a reverse bias voltage value of the Zener diode.

6. The abnormal detection circuit according to claim 1, the three-phase AC power comprising a first phase AC power, a second phase AC power, and a third phase AC power, wherein the voltage detection circuit comprises:
   a first detection circuit, configured to detect the first phase AC power, and when detecting the abnormality in a voltage value of the first phase AC power, using the driving power to output one of a first phase over voltage control signal and a first phase under voltage control signal corresponding to the abnormality;
   a second detection circuit, configured to detect the second phase AC power, and when detecting the abnormality in a voltage value of the second phase AC power, using the driving power to output one of a second phase over voltage control signal and a second phase under voltage control signal corresponding to the abnormality; and
   a third detection circuit, configured to detect the third phase AC power, and when detecting the abnormality in a voltage value of the third phase AC power, using the driving power to output one of a third phase over voltage control signal and a third phase under voltage control signal corresponding to the abnormality.

7. The abnormal detection circuit according to claim 6, wherein the first detection circuit comprises:
   a rectifier circuit, configured to rectify the first phase AC power to generate a rectified first phase power;
   an over voltage detection circuit, coupled to the rectifier circuit, configured to detect whether an over voltage occurs in a voltage value of the rectified first phase power, and using the driving power to output the first phase over voltage control signal when the over voltage occurs in the voltage value of the rectified first phase power; and an under voltage detection circuit, coupled to the rectifier circuit, configured to detect whether an under voltage occurs in a voltage value of the rectified first phase power, and using the driving power to output the first phase under voltage control signal when the under voltage occurs in the voltage value of the rectified first phase power.

8. The abnormal detection circuit according claim 7, wherein the rectifier circuit comprises:
a rectifier diode, an anode of the rectifier diode receiving the first phase AC power, and the anode of the rectifier diode serving as an output end of the rectifier circuit; and
a rectifier capacitor, a first end of the rectifier capacitor being coupled to a cathode of the rectifier diode, and a second end of the rectifier capacitor being coupled to a reference low voltage or a neutral point of the three-phase AC power.

9. The abnormal detection circuit according to claim 8, wherein the over voltage detection circuit comprises:
a first Zener diode, a cathode of the first Zener diode being coupled to the output end of the rectifier circuit; and
a normal open relay, a first control end of the normal open relay being coupled to an anode of the first Zener diode, a second control end of the normal open relay being coupled to the second end of the rectifier capacitor, a first signal end of the normal open relay receiving the driving power, and a second signal end of the normal open relay serving as an output end of the over voltage detection circuit; and
a first level resistor, coupled between the second signal end of the normal open relay and the reference low voltage.

10. The abnormal detection circuit according to claim 9, wherein:
When a voltage value of the rectified first phase power is greater than a reverse bias voltage value of the first Zener diode, the normal open relay is turned on to use the driving power as the first phase over voltage control signal, and
When the voltage value of the rectified first phase power is smaller than or equal to the reverse bias voltage value of the first Zener diode, the normal open relay is turned off.

11. The abnormal detection circuit according to claim 9, wherein the under voltage detection circuit comprises:
a second Zener diode, a cathode of the second Zener diode being coupled to the output end of the rectifier circuit;
a normal close relay, a first control end of the normal close relay being coupled to an anode of the second Zener diode, a second control end of the normal close relay being coupled to the second end of the rectifier capacitor, a first signal end of the normal close relay receiving the driving power, and a second signal end of the normal close relay serving as an output end of the under voltage detection circuit; and a second level resistor, coupled between the second signal end of the normal close relay and the reference low voltage.

12. The abnormal detection circuit according to claim 11, wherein:
when a voltage value of the rectified first phase power is smaller than or equal to a reverse bias voltage value of the second Zener diode, the normal close relay is turned on to use the driving power as the first phase under voltage control signal, and
when the voltage value of the rectified first phase power is greater than the reverse bias voltage value of the second Zener diode, the normal close relay is turned off.

13. The abnormal detection circuit according to claim 11, wherein a reverse bias voltage value of the second Zener diode is smaller than a reverse bias voltage value of the first Zener diode.

14. The abnormal detection circuit according to claim 6, wherein the warning circuit further comprises:
a second phase warning circuit, coupled to the second detection circuit, configured to be driven by receiving the driving power, providing a second phase over voltage warning signal in response to the second phase over voltage control signal, and providing a second phase under voltage warning signal in response to the second phase under voltage control signal; and
a third phase warning circuit, coupled to the third detection circuit, configured to be driven by receiving the driving power, providing a third phase over voltage warning signal in response to the third phase over voltage control signal, and providing a third phase under voltage warning signal in response to the third phase under voltage control signal.

15. The abnormal detection circuit according to claim 1, wherein the first phase warning circuit further comprises:
a first light-emitting element, coupled in series with the first switch between the driving power and the reference low voltage; and
a second light-emitting element, coupled in series with the second switch between the driving power and the reference low voltage,
wherein the first switch is turned on in response to the first phase over voltage control signal, so as to enable the first light-emitting element to output the first phase over voltage warning signal, and
wherein the second switch is turned on in response to the first phase under voltage control signal, so as to enable the second light-emitting element to output the first phase under voltage warning signal.

16. The abnormal detection circuit according to claim 1, wherein the first phase over voltage warning signal is different from the first phase under voltage warning signal.

* * * * *